United States Patent
Lu et al.

(10) Patent No.: US 11,302,869 B2
(45) Date of Patent: Apr. 12, 2022

(54) MANUFACTURING METHOD OF VIA-HOLE CONNECTION STRUCTURE, ARRAY SUBSTRATE AND MANUFACTURING METHOD THEREOF, DISPLAY DEVICE AND MANUFACTURING METHOD THEREOF

(71) Applicant: BOE TECHNOLOGY GROUP CO., LTD., Beijing (CN)

(72) Inventors: Pengcheng Lu, Beijing (CN); Xiaochuan Chen, Beijing (CN); Shengji Yang, Beijing (CN); Kuanta Huang, Beijing (CN); Hui Wang, Beijing (CN); Yanming Wang, Beijing (CN); Weihai Wang, Beijing (CN); Guohong Qin, Beijing (CN); Yage Song, Beijing (CN); Jiantong Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 374 days.

(21) Appl. No.: 16/473,950

(22) PCT Filed: Dec. 26, 2018

(86) PCT No.: PCT/CN2018/123956
§ 371 (c)(1),
(2) Date: Jun. 26, 2019

(87) PCT Pub. No.: WO2019/214253
PCT Pub. Date: Nov. 14, 2019

(65) Prior Publication Data
US 2021/0351353 A1    Nov. 11, 2021

(30) Foreign Application Priority Data
May 7, 2018    (CN) .......................... 201810428335.1

(51) Int. Cl.
H01L 51/52    (2006.01)
H01L 51/00    (2006.01)
H01L 27/32    (2006.01)

(52) U.S. Cl.
CPC ...... H01L 51/0021 (2013.01); H01L 27/3276 (2013.01); H01L 2227/323 (2013.01)

(58) Field of Classification Search
None
See application file for complete search history.

(56) References Cited

U.S. PATENT DOCUMENTS 7,947,539 B2    5/2011    You
8,587,127 B2    11/2013   Chiou et al.
(Continued)

FOREIGN PATENT DOCUMENTS

CN    102832200 A    12/2012
CN    103579532 A    2/2014
(Continued)

OTHER PUBLICATIONS

International Search Report of PCT/CN2018/123956 in Chinese, dated Apr. 1, 2019 with English translation.
(Continued)

*Primary Examiner* — Benjamin P Sandvik
(74) *Attorney, Agent, or Firm* — Collard & Roe, P.C.

(57) ABSTRACT

A manufacturing method of a via-hole connection structure, a manufacturing method of an array substrate and an array substrate are provided by the embodiments of the present disclosure, and the manufacturing method of the via-hole connection structure includes: forming an insulation layer on a base substrate and forming a first via hole in the insulation layer; forming a connection portion in the first via hole; forming a protection layer covering the connection portion on a surface of the insulation layer; forming a second via
(Continued)

hole in the insulation layer and in the protection layer; removing at least a portion of the protection layer to expose the connection portion.

18 Claims, 6 Drawing Sheets

(56) References Cited

U.S. PATENT DOCUMENTS

| | | | |
|---|---|---|---|
| 9,379,170 B2* | 6/2016 | Cho | H01L 27/1288 |
| 9,443,879 B2 | 9/2016 | Jeong et al. | |
| 9,445,506 B2 | 9/2016 | Li et al. | |
| 10,790,341 B2* | 9/2020 | Guo | H01L 27/3227 |
| 2006/0113903 A1* | 6/2006 | Kim | H01L 27/3251 |
| | | | 313/506 |
| 2015/0362855 A1* | 12/2015 | Mizuno | G03G 15/04 |
| | | | 345/156 |
| 2017/0271423 A1* | 9/2017 | Murai | H01L 27/3276 |
| 2018/0366586 A1* | 12/2018 | Son | H01L 27/1262 |
| 2020/0219961 A1* | 7/2020 | Managaki | H01L 51/0097 |

FOREIGN PATENT DOCUMENTS

| | | |
|---|---|---|
| CN | 103824865 A | 5/2014 |
| CN | 104091761 A | 10/2014 |
| CN | 106129006 A | 11/2016 |
| CN | 106847830 A | 6/2017 |
| CN | 106941093 A | 7/2017 |
| JP | 2007294951 A | 11/2007 |

OTHER PUBLICATIONS

Notice of Transmittal of the International Search Report of PCT/CN2018/123956 in Chinese, dated Apr. 1, 2019.

Written Opinion of the International Searching Authority of PCT/CN2018/123956 in Chinese, dated Apr. 1, 2019 with English translation.

First Chinese Office Action in 201810428335.1 dated Mar. 30, 2021 with English translation.

Chinese Office Action in Chinese Application No. 201810428335.1 dated Sep. 3, 2021 with English transliation.

* cited by examiner

MANUFACTURING METHOD OF VIA-HOLE CONNECTION STRUCTURE, ARRAY SUBSTRATE AND MANUFACTURING METHOD THEREOF, DISPLAY DEVICE AND MANUFACTURING METHOD THEREOF

CROSS REFERENCE TO RELATED APPLICATIONS

This application is the National Stage of PCT/CN2018/123956 filed on Dec. 26, 2018, which claims priority under 35 U.S.C. § 119 of Chinese Application No. 201810428335.1 filed on May 7, 2018, the disclosure of which is incorporated by reference.

TECHNICAL FIELD

At least one embodiment of the present disclosure relates to a manufacturing method of a via-hole connection structure, a manufacturing method of an array substrate and an array substrate.

BACKGROUND

A display panel generally includes a display region and a bonding pad region, and the bonding pad region is used for bonding with an external element to provide a signal, such as a power voltage signal, for the display panel after devices in the display region are manufactured. How to allow a manufacturing process of a via-hole connection structure in the bonding pad region not to adversely affect the devices in the display region is an issue concerned in the art.

SUMMARY

At least one embodiment of the present disclosure provides a manufacturing method of a via-hole connection structure, and the method comprises: forming an insulation layer on a base substrate and forming a first via hole in the insulation layer; forming a connection portion in the first via hole; forming a protection layer covering the connection portion on a surface of the insulation layer; forming a second via hole in the insulation layer and in the protection layer; removing at least a portion of the protection layer to expose the connection portion.

For example, the manufacturing method further comprises: forming a first contact electrode and a second contact electrode on the base substrate before forming the insulation layer, in which the insulation layer covers the first contact electrode and the second contact electrode, the first via hole and the second via hole respectively expose at least a portion of the first contact electrode and at least a portion of the second contact electrode, and the first contact electrode is electrically connected to the connection portion.

For example, the first contact electrode and the second contact electrode are formed in a same layer on the base substrate.

For example, removing the at least a portion of the protection layer comprises: coating a first photoresist layer on the protection layer, exposing and developing the first photoresist layer using a first mask plate to form a first etching mask, wherein the first etching mask comprises a portion remaining in the second via hole; and etching the protection layer using the first etching mask.

For example, forming the second via hole in the insulation layer and in the protection layer comprises: coating a second photoresist layer on the protection layer, and exposing and developing the second photoresist layer using a second mask plate to form a second etching mask; and etching the protection layer and the insulation layer using the second etching mask.

For example, the first mask plate and the second mask plate are a same mask plate or have a same pattern, and the first photoresist layer and the second photoresist layer respectively adopt photoresist materials with opposite properties.

For example, forming the connection portion comprises: forming a conductive layer on the insulation layer, wherein the conductive layer fills the first via hole, performing a polishing treatment to remove the conductive layer on the surface of the insulation layer.

For example, the manufacturing method further comprises: forming a first electrode on the insulation layer after removing the at least a portion of the protection layer, in which the first electrode is electrically connected to the connection portion.

For example, the manufacturing method further comprises: forming a second electrode in the second via hole at a same time as forming the first electrode.

At least one embodiment of the present disclosure further provides a manufacturing method of an array substrate, the array substrate comprises the via-hole connection structure, and the manufacturing method comprises: forming the via-hole connection structure by the manufacturing method mentioned above.

For example, the array substrate comprises a display region and a bonding pad region, the first via hole is in the display region and the second via hole is in the bonding pad region.

For example, the manufacturing method further comprises: forming a first contact electrode and a second contact electrode on the base substrate before forming the insulation layer, in which the insulation layer covers the first contact electrode and the second contact electrode, the first via hole and the second via hole respectively expose at least a portion of the first contact electrode and at least a portion of the second contact electrode, and the first contact electrode is electrically connected to the connection portion.

For example, the manufacturing method further comprises: forming a first electrode on the insulation layer after removing the at least a portion of the protection layer, in which the first electrode is electrically connected to the connection portion.

For example, the manufacturing method further comprises: forming an organic light emitting diode on the first electrode.

For example, the array substrate comprises a source-drain electrode layer and a gate electrode layer, the first contact electrode and the second contact electrode are formed in a same layer as the source-drain electrode layer, or the first contact electrode and the second contact electrode are respectively formed in a same layer as the source-drain electrode layer and the gate electrode layer.

At least one embodiment of the present disclosure further provides an array substrate formed by the manufacturing method mentioned above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

Figure 1A:
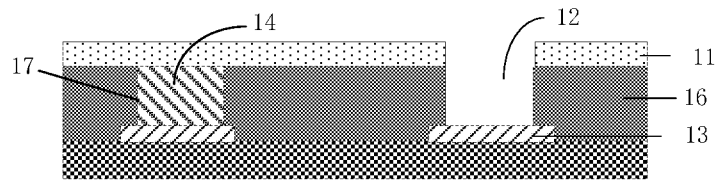
FIG. 1A-FIG. 1C are schematic diagrams of steps of a manufacturing method of a via-hole connection structure.
Figure 1B:
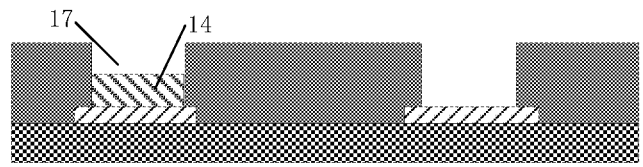
Figure 1C:
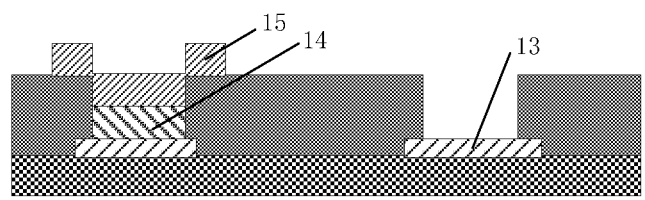

The inventor found that a manufacturing process of a via hole is easy to cause adverse effects on a connection portion that has been formed in the via hole; for example, in a manufacturing process of a contact hole in a bonding pad region, it is easy to cause adverse effects such as corrosion or peeling off of the connection portion in the via hole used for the pixel electrode in a display region. As illustrated in FIG. 1A-FIG. 1C, a contact hole 12 is formed by etching an insulation layer 16 using a photoresist layer 11 as a mask, to expose a contact electrode 13 in the bonding pad region. Then, when the photoresist layer 11 is peeled off, a portion of a conductive material of a connection portion 14 in a pixel electrode via hole 17 is easily brought out, and thereby a gap is formed on the connection portion 14 in the pixel electrode via hole 17. The gap causes a pixel electrode 15 formed on the connection portion 14 to be easily broken or causes a large segment difference on a surface of the pixel electrode 15 (as shown in FIG. 1C), which not only easily causes poor contact between the pixel electrode 15 and the connection portion 14, but also easily causes adverse effects on light emitting elements and the like subsequently formed on the pixel electrode 15, and thus causes a display device thus obtained has defects such as nonuniform display, etc.

At least one embodiment of the present disclosure provides a manufacturing method of a via-hole connection structure, an array substrate and a manufacturing method thereof, which can protect a connection portion in the via-hole connection structure so that a structure formed on the connection portion has a relatively flat surface, and thus a manufacturing process is improved.

Figure 2:
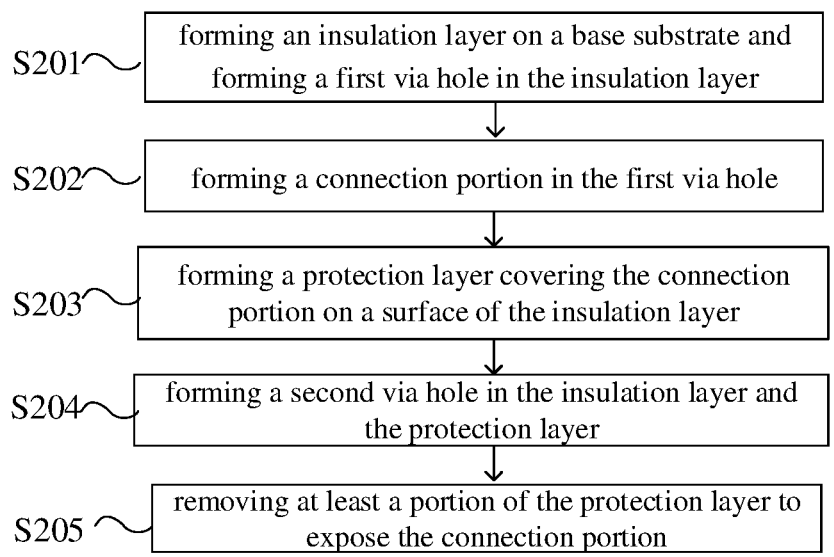
FIG. 2 is a flow chart of a manufacturing method of a via-hole connection structure provided by an embodiment of the disclosure of the present disclosure.

FIG. 2 is a flow chart of a manufacturing method of a via-hole connection structure provided by an embodiment of the disclosure of the present disclosure, and FIG. 3A-FIG. 3I are schematic diagrams of steps of the manufacturing method. As illustrated in the figures, the manufacturing method of the via-hole connection structure comprises the following steps.

Figure 3A:
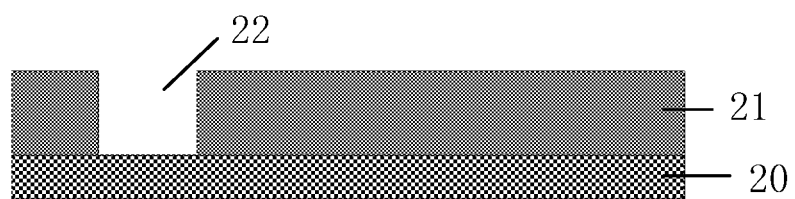
FIG. 3A-FIG. 3I are schematic diagrams of steps of a manufacturing method of a via-hole connection structure provided by an embodiment of the disclosure of the present disclosure.

Step S201: as illustrated in FIG. 3A, forming an insulation layer 21 on a base substrate 20 and forming a first via hole 22 in the insulation layer.

For example, the base substrate 20 may be an inorganic substrate (for example, glass substrate, quartz substrate, sapphire substrate, silicon wafer, etc.) or an organic flexible substrate (for example, polyimide (PI) substrate, polyethylene terephthalate (PET) substrate, polycarbonate substrate, polyacrylate substrate, polyetherimide substrate, polyethersulfone substrate, etc.), and the embodiment includes but is not limited to this.

For example, the substrate is a silicon wafer, and a manufacturing process of the via-hole connection structure can be compatible with a silicon-based process, which is conducive to achieving a higher resolution (PPI).

For example, the insulation layer 21 includes an inorganic insulation material such as silicon nitride, silicon oxynitride or the like, or aluminum oxide, titanium nitride or the like. For example, the insulation layer also includes an organic insulation material such as acrylic acid, polymethyl methacrylate (PMMA), etc. For example, the insulation layer is a single-layer structure or a multi-layer structure.

For example, the insulation layer 21 is formed using a chemical vapor deposition process (for example, for forming an inorganic insulation material) or a process such as spin coating, printing (for example, for forming an organic insulation material), etc.

For example, the first via hole 22 is formed by a conventional photolithography process including coating of a photoresist, exposure, development, etching, photoresist stripping and other steps, and a further description is not given here.

For example, a depth of the first via hole 22 is in an order of microns, for example, between several microns and 10 microns.

Step S202: forming a connection portion 23 in the first via hole 22.

Figure 3B:
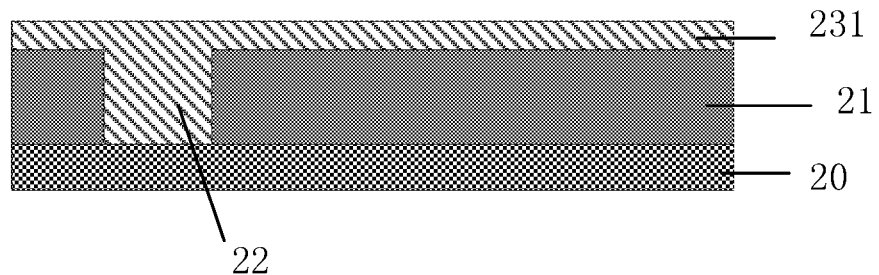

As illustrated in FIG. 3B, the forming the connection portion includes forming a conductive layer 231 on a surface of the insulation layer 21 including the first via hole 22, and the conductive layer 231 is filled in the first via hole 22. For example, a material of the conductive layer includes at least one of gold (Au), silver (Ag), copper (Cu), aluminum (Al), molybdenum (Mo), magnesium (Mg), tungsten (W) and an alloy material formed by combining the above metals; or the material of the conductive layer includes a conductive metal oxide material such as indium tin oxide (ITO), indium zinc oxide (IZO), zinc oxide (ZnO), aluminum zinc oxide (AZO), etc.

For example, a process of forming the conductive layer 231 includes processes such as sputtering, physical vapor deposition or chemical vapor deposition, etc. For example, in a case where the depth of the first via hole is large, the conductive layer 231 is formed first to fill the via hole, which can prevent a segment difference of an electrode material formed subsequently from being too large or even prevent the electrode material from being broken.

Figure 3C:

As illustrated in FIG. 3C, in an example of this embodiment, the connection portion 23 in the first via hole 22 is formed using a patterning process so that a conductive via-hole structure is obtained.

In another example of this embodiment, a polishing treatment is performed on the conductive layer 231 to remove a portion, which is on the surface of the insulation layer 21, of the conductive layer 231 but to retain a portion, which is in the first via hole 22, of the conductive layer 231.

For example, the polishing treatment allows a surface of the conductive layer to flush with the insulation layer 21.

For example, the polishing treatment includes a physical polishing process or a chemical polishing process, such as a chemical mechanical polishing process.

Performing the polishing treatment on the conductive layer to form the connection portion can avoid a damage to the connection portion caused by stripping of a photoresist in a photolithography process.

Figure 3D:
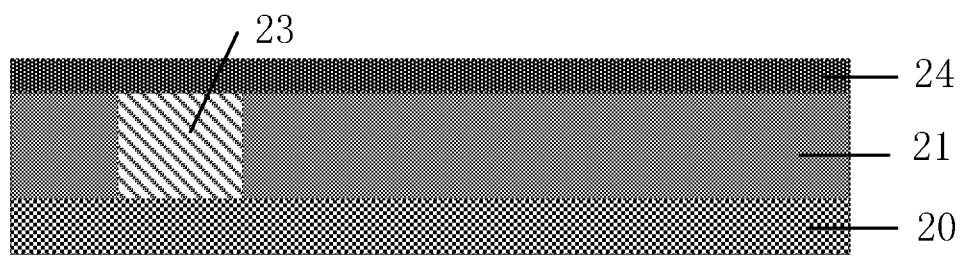

Step S203: as illustrated in FIG. 3D, forming a protection layer 24 covering the connection portion 23 on the surface of the insulation layer 21.

For example, the protection layer 24 includes an inorganic insulation material, such as a silicon oxynitride material such as silicon nitride and silicon oxynitride, etc., or a metal oxynitride material such as aluminum oxide and titanium nitride, etc. For example, the insulation layer also includes an organic insulation material such as acrylic acid, polymethyl methacrylate (PMMA), etc. For example, the insulation layer is a single-layer structure or a multi-layer structure.

For example, the protection layer 24 is formed using a chemical vapor deposition process (for example, forming an inorganic insulation material) or a process such as spin coating, printing (for example, forming an organic insulation material), etc.

Step S204: forming a second via hole 25 in the insulation layer 21 and in the protection layer 24.

Figure 3E:
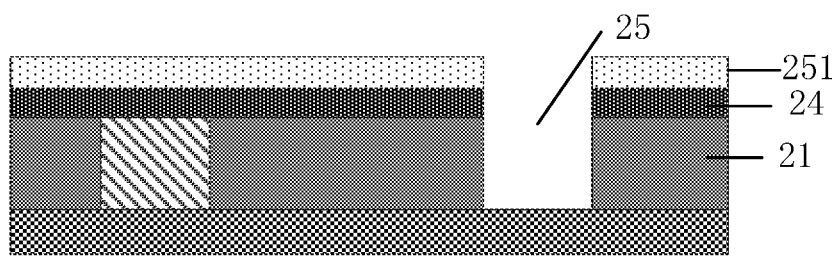

As illustrated in FIG. 3E, a first photoresist layer is formed on the protection layer 24, and the first photoresist layer is exposed and developed using a first mask plate to form a first etching mask 251. The protection layer 24 and the insulation layer 21 are etched using the first etching mask 251 to form a second via hole 25 passing through the protection layer 24 and the insulation layer 21, and then the first etching mask 251 on the surface of the protection layer 24 is removed.

For example, the first photoresist layer adopts a positive photoresist material, and a light transmission region of a pattern of the first mask plate corresponds to a region of the second via hole.

Or, for example, the first photoresist layer adopts a negative photoresist material, and an opaque region of the first mask plate corresponds to the region of the second via hole.

Step S205: removing at least a portion of the protection layer 24 to expose the connection portion 23.

Figure 3F:
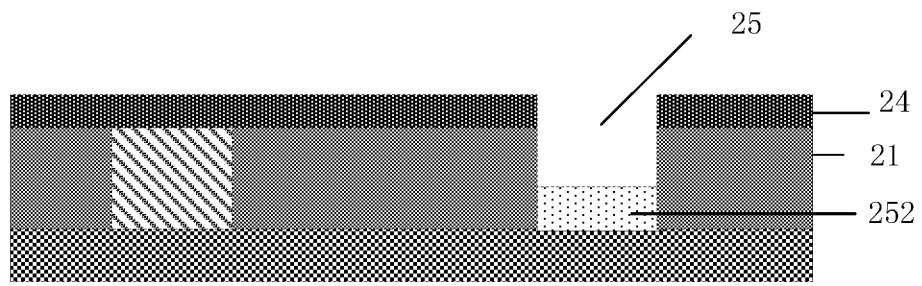

For example, as illustrated in FIG. 3F, in one example, the protection layer 24 is removed to expose the connection portion 23 using a photolithography process, and the photolithography process includes: forming a second photoresist layer on the protection layer 24, exposing and developing the second photoresist layer using a second mask plate to form a second etching mask 252 including a portion remaining in the second via hole, and etching the protection layer 24 using the second etching mask to remove at least a portion of the protection layer 24 and expose the connection portion 23. The second etching mask can protect materials in the second via hole (such as a second contact electrode in the following embodiment) from damage in a subsequent etching process of the protection layer.

Figure 3G:
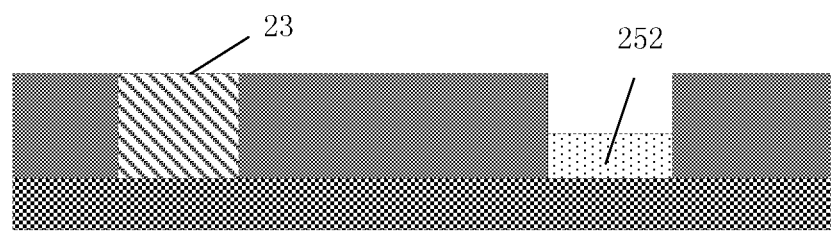

For example, in one example, the second mask plate and the first mask plate are a same mask plate or have a same pattern (light transmission region), and meanwhile the second photoresist layer and the first photoresist layer are made of photoresist materials with opposite properties, so that an obtained pattern of the second etching mask 252 is complementary to an obtained pattern of the first etching mask 251, as illustrated in FIG. 3G, and thus one mask plate is saved and a manufacturing cost is reduced.

For example, the first photoresist layer adopts a positive photoresist material and the second photoresist material adopts a negative photoresist material; or, the first photoresist layer adopts a negative photoresist material and the second photoresist material adopts a positive photoresist material.

Figure 3H:
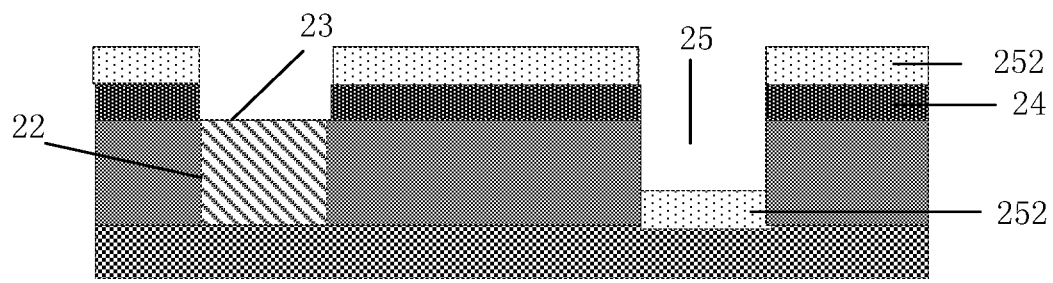

In one example of this embodiment, the second etching mask 252 includes only a portion remaining in the second via hole 25, and the protection layer 24 is completely exposed and thus is completely removed. In other examples of this embodiment, the second etching mask 252 may expose only a portion of the protection layer 24 so that only the portion of the protection layer 24 is removed to expose the connection portion 23. For example, as illustrated in FIG. 3H, in this step, the second etching mask 252 only exposes a portion, which corresponds to the first via hole 22, of the protection layer 24, and thus only the portion, which corresponds to the first via hole 22, of the protection layer 24 is removed. In an actual process, a pattern of the protection layer can be selected as required.

Figure 3I:
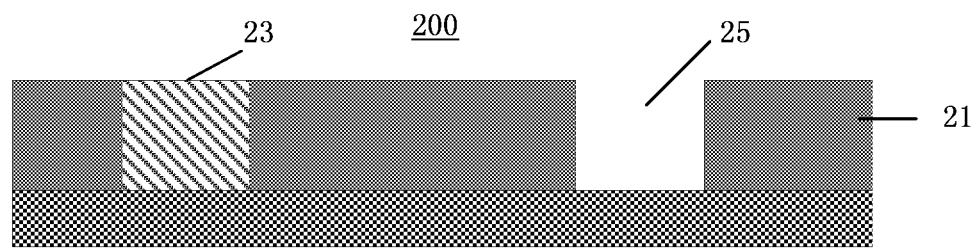

As illustrated in FIG. 3I, the second etching mask 252 is removed and thus the via-hole connection structure 200 is formed. Because the surface of the connection portion 23 is not covered by the second etching mask, the surface 23 of the connection portion is not affected by a process of peeling off the second etching mask during removing the second etching mask.

In the manufacturing method of the via-hole connection structure provided by at least one embodiment of the present disclosure, a protection layer is formed before forming the second via hole to protect the connection portion, which prevents the photoresist from being directly formed on the surface of the connection portion, and thus a damage to the connection portion caused by a stripping process of the photoresist is avoided, so that the via-hole connection structure has a complete contact surface, which is beneficial to forming subsequent devices.

Figure 4A:
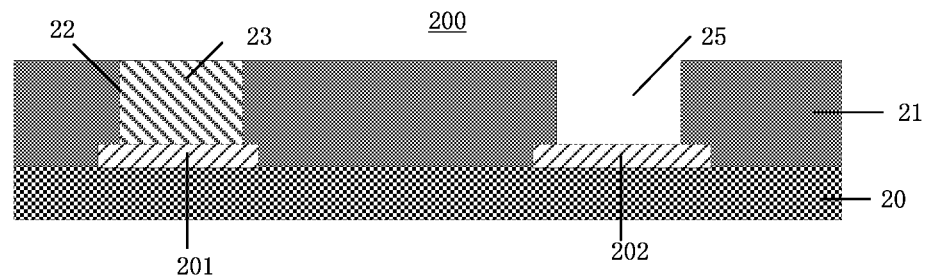
FIG. 4A-FIG. 4C are schematic diagrams of steps of a manufacturing method of a via-hole connection structure provided by another embodiment of the disclosure of the present disclosure.
Figure 4B:
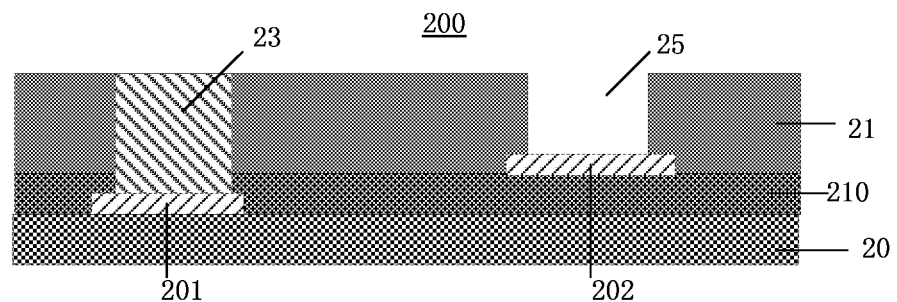
Figure 4C:
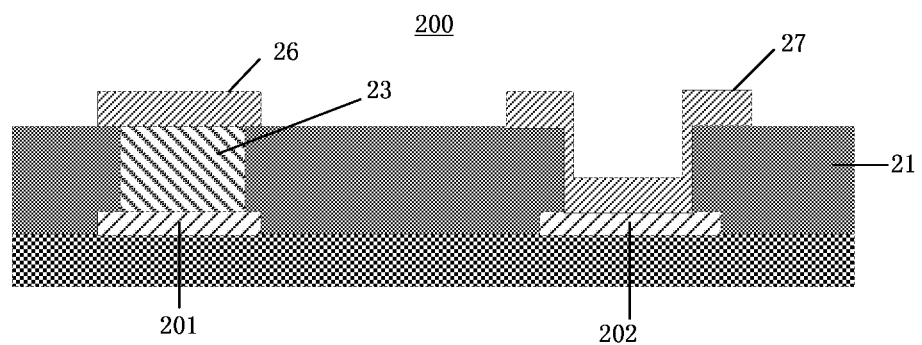

FIG. 4A-FIG. 4C are schematic diagrams of steps of a manufacturing method of a via-hole connection structure provided by another embodiment of the disclosure of the present disclosure. This manufacturing method is substantially the same as that of the via-hole connection structure provided by the previous embodiment, and differences between the two are mainly explained in detail below, and the same parts are not repeated here.

As illustrated in FIG. 4A, the manufacturing method of the via-hole connection structure further includes forming a first contact electrode 201 and a second contact electrode 202 on the base substrate 20 before forming the insulation layer 21 covering the first contact electrode 201 and the second contact electrode 202, the first via hole 22 exposes at least a portion of the first contact electrode 201 and the second via hole 25 expose at least a portion of the second contact electrode 202, and the first contact electrode 201 is electrically connected to the connection portion 23.

For example, as illustrated in FIG. 4A, the first contact electrode 201 and the second contact electrode 202 are formed in a same layer on the base substrate.

It should be noted that the description "formed in a same layer" in this disclosure means that two structures (such as the first contact electrode and the second contact electrode) are formed by a same material as well as by a same deposition process and a same patterning process.

For example, as illustrated in FIG. 4B, the first contact electrode 201 and the second contact electrode 202 are formed in different layers on the base substrate, for example, one or more interlayer insulation layers 210 are provided between the first contact electrode 201 and the second contact electrode 202. In this case, for example, the first contact electrode and the second contact electrode may include a same conductive material or different conductive materials.

For example, the conductive material used to form the first contact electrode 201 and the second contact electrode 202 includes any of gold (Au), silver (Ag), copper (Cu), aluminum (Al), molybdenum (Mo), magnesium (Mg), tungsten (W), and an alloy material formed by a combination of the above metals; or the conductive material includes a conductive metal oxide material such as indium tin oxide (ITO), indium zinc oxide (IZO), zinc oxide (ZnO), aluminum zinc oxide (AZO), etc.

For example, as illustrated in FIG. 4C, in an example of the embodiment, after the above mentioned via-hole connection structure is formed, a first electrode 26 is formed on the insulation layer 21, and the first electrode is electrically connected to the connection portion 23, that is, the first electrode is electrically connected to the first contact electrode 201. Because the connection portion 23 has a flat surface, the first electrode 26 and the connection portion 23 have a flat contact interface, which is beneficial to forming a good electrical contact between the first electrode 26 and the connection portion 23. The first electrode 26 may be made of different materials such as a metal material or a conductive metal oxide or the like as required.

For example, as illustrated in the figures, the manufacturing method further includes forming a second electrode 27 which is electrically connected to the second contact electrode 202 and can also provide protection functions such as oxidation prevention, etc. for the second contact electrode 202, that is, the second contact electrode 202 works as a protection electrode. For example, the second electrode 27 and the first electrode 26 are formed in a same patterning process.

At least one embodiment of the present disclosure further provides an array substrate and a manufacturing method thereof. The array substrate comprises a via-hole connection structure, and the manufacturing method of the array substrate comprises forming the via-hole connection structure by the manufacturing method mentioned above.

For example, the array substrate is an array substrate used for a liquid crystal display device or an array substrate used for an organic light emitting diode (OLED) display device, and for example, the liquid crystal display device and the OLED display device are respectively a silicon-based liquid crystal display device and a silicon-based OLED display device. The via-hole connection structure may be in a display region of the array substrate, or in a non-display region of the array substrate, or partially in the display region, or partially in the non-display region. Those skilled in the art should understand that as long as the array substrate includes the via-hole connection structure formed by the above manufacturing method, the array substrate and the manufacturing method thereof fall within the scope of protection of the present disclosure.

Figure 5:
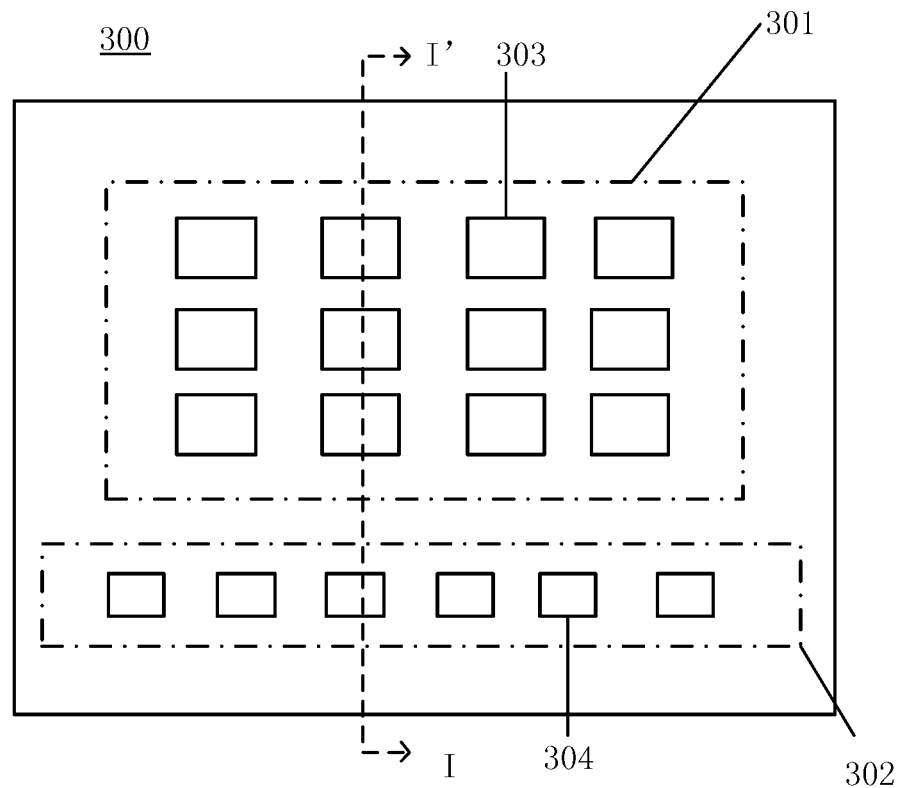
FIG. 5 is a schematic plane view of an array substrate provided by an embodiment of the present disclosure.
Figure 6A:
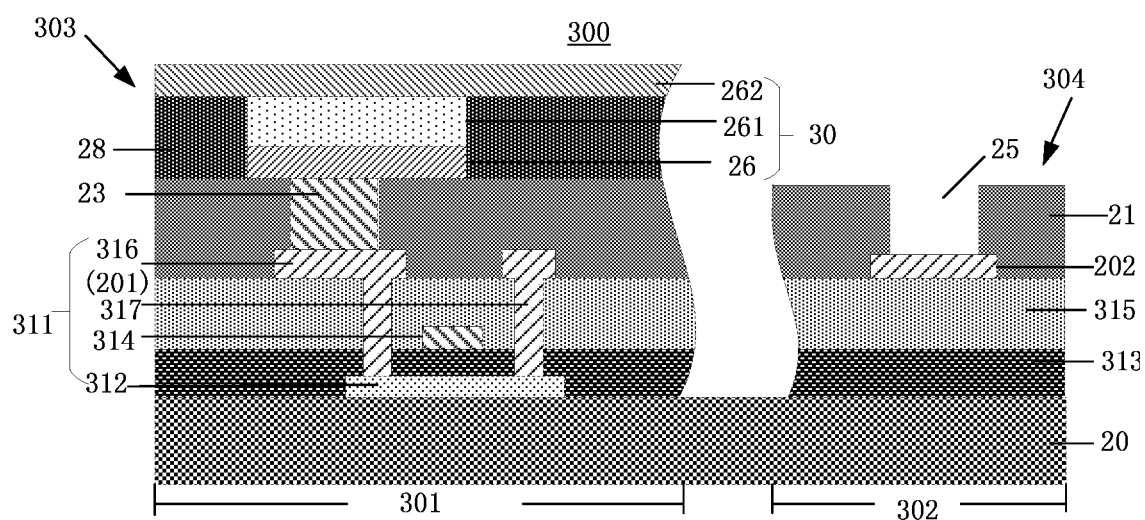
FIG. 6A and FIG. 6B are local cross-sectional views of the array substrate in FIG. 5.
Figure 6B:
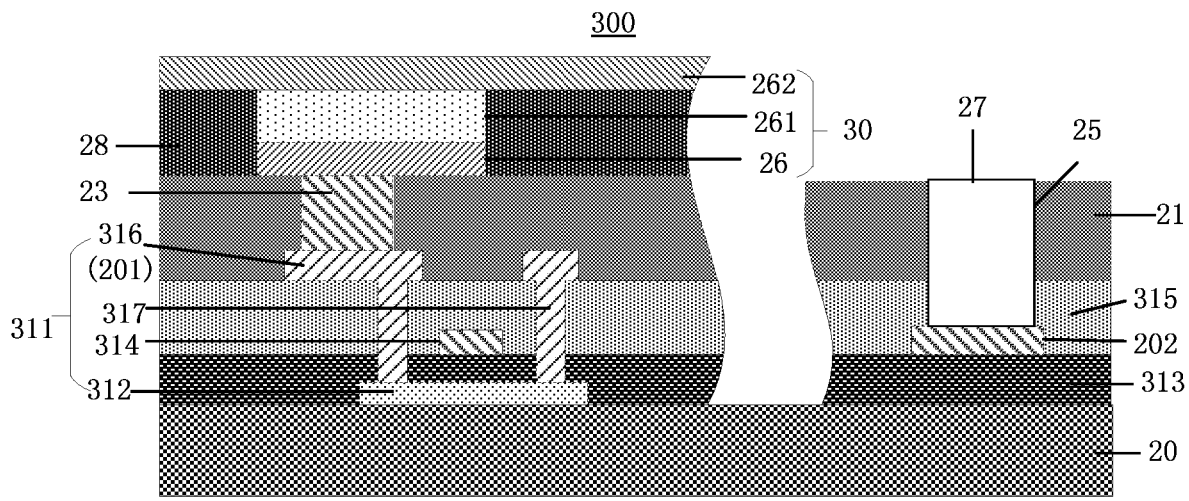
Figure 7:
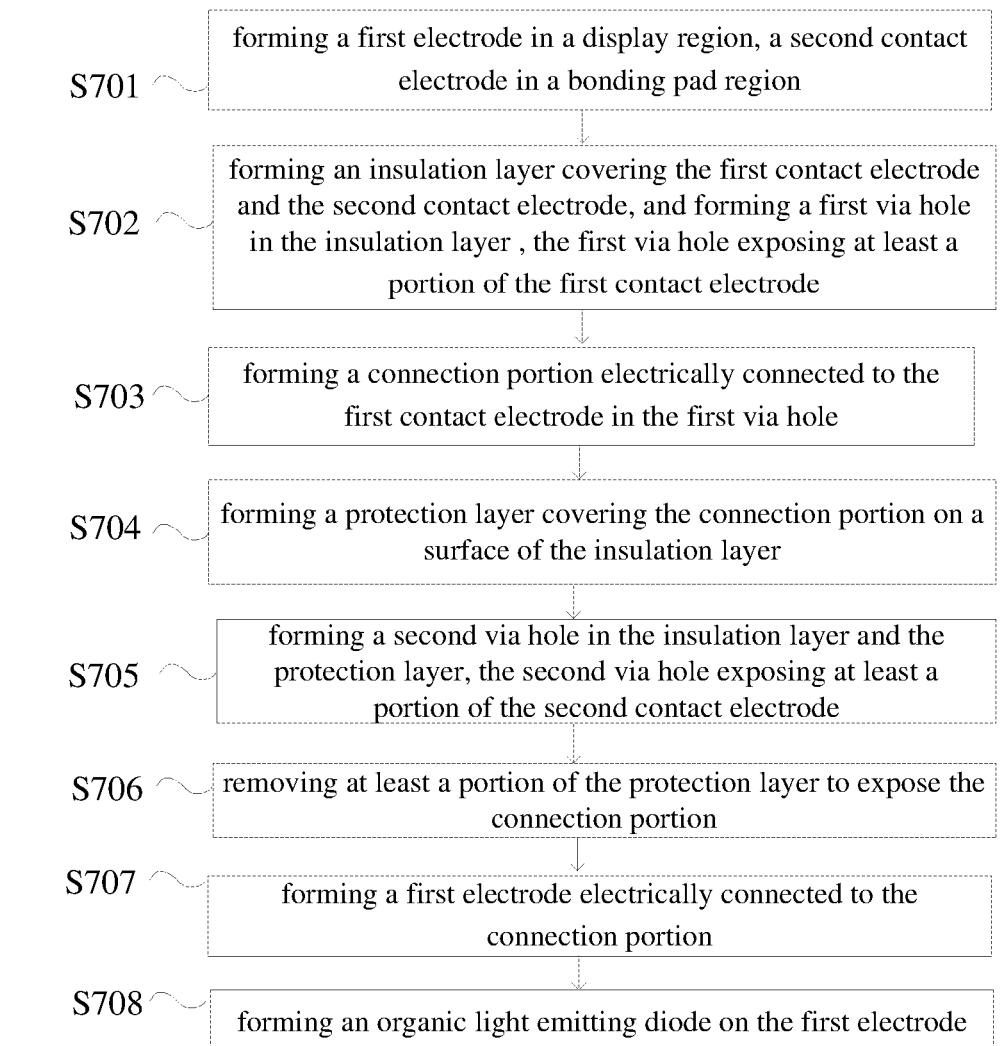
FIG. 7 is a flow chart of a manufacturing method of an array substrate provided by an embodiment of the disclosure.

FIG. 5 is a schematic plane view of an array substrate provided by an embodiment of the present disclosure, FIG. 6A and FIG. 6B illustrate different examples of local cross-sectional views of FIG. 5 taken along a section line I-I', and FIG. 7 is a flow chart of a manufacturing method of an array substrate provided by an embodiment of the disclosure.

Taking an array substrate for forming an OLED display device as an example, the array substrate and the manufacturing method thereof provided in the embodiment of the present disclosure will be exemplarily described below with reference to FIG. 5, FIGS. 6A-6B and FIG. 7. For convenience of explanation, the same elements as those of the above-mentioned embodiments are denoted by the same reference numerals and are not described again here.

As illustrated in FIG. 5, the array substrate 300 includes a display region 301 and a bonding pad region 302 in a non-display region outside the display region 301. The display region 301 is provided with a plurality of pixel units 303 arranged in an array, each of the plurality of pixel units includes at least one organic light emitting diode and a pixel circuit connected to the at least one organic light emitting diode, and the organic light emitting diode emits light under a drive of the pixel circuit. For example, the pixel circuit is a 2T1C pixel circuit which includes two transistors and a capacitor, and one of the two transistors is a switching transistor and the other is a driving transistor. For example, the pixel circuit is also a pixel circuit of other structures, and for example, the pixel circuit is a 3T1C pixel circuit based on the 2T1C pixel circuit mentioned above or a pixel circuit further including a compensation function, a reset function, etc. No limitation is imposed to this in embodiments of the present disclosure.

The bonding pad region 302 is provided with a plurality of bonding pads 304 which are used to bond with external components (such as a gate driving circuit, a data driving circuit, a power supply, etc.) to provide signals for the array substrate, such as a gate scan signal, a display data signal, a power supply voltage signal (such as VDD, VSS), etc. after the device in the display region is formed.

As illustrated in FIG. 6A, FIG. 6B and FIG. 7, the manufacturing method of the array substrate includes the following steps.

Step S701: forming a first contact electrode 201 on the base substrate 20 corresponding to the display region 301 and forming a second contact electrode 202 on the base substrate 20 corresponding to the bonding pad region 302.

For example, the base substrate 20 is an inorganic substrate (for example, glass substrate, quartz substrate, sapphire substrate, silicon wafer, etc.) or an organic flexible substrate (for example, polyimide (PI) substrate, polyethylene terephthalate (PET) substrate, polycarbonate substrate, polyacrylate substrate, polyetherimide substrate, polyethersulfone substrate, etc.), and the embodiment includes but is not limited to this.

In one example, for example, the base substrate 20 is a glass substrate or an organic substrate. As illustrated in FIG. 6A and FIG. 6B, a pixel circuit 310 is formed on the base substrate 20, and the pixel circuit includes, for example, a conventional OLED pixel driving circuit including, for example, a switching transistor, a driving transistor, and a storage capacitor, or further including a reset transistor, a light emission control transistor, etc. and no limitation is imposed to the specific structure of the pixel circuit in embodiment. In order to be clear, FIG. 6A and FIG. 6B only illustrate a transistor directly connected to the pixel circuit, for example, the transistor is a driving transistor 311 of the OLED which is configured to operate in a saturated state and control a value of a current for driving the OLED to emit light. For example, the transistor is also a light emission control transistor for controlling whether the current for driving OLED to emit light flows. No limitation is imposed to this in this embodiment.

For example, the pixel circuit is manufactured based on a thin film transistor process. A manufacturing method of the pixel circuit may be a manufacturing method of a conventional pixel driving circuit including conventional process steps such as sputtering (for example, for forming a metal layer and a metal oxide layer), chemical vapor deposition (for example, for forming an inorganic dielectric layer), inkjet printing or spin coating (for example, for forming an organic dielectric layer), photolithography (e.g., for performing a patterning process), etc.

For example, the manufacturing method of the pixel circuit includes forming an active layer 312, a gate insulation layer 313, a gate electrode layer (including a gate 314 and a gate line connected thereto), an interlayer insulation layer 315, and a source-drain electrode layer (including a source electrode 316, a drain electrode 317, a data line, etc.) on the base substrate 20, so as to form the driving transistor 311 in the display region. The active layer 312 may include a single substance semiconductor material or a compound semiconductor material, and for example, amorphous silicon, polysilicon, metal oxide semiconductor, and the like.

In another example, for example, the base substrate 20 is a silicon-based substrate. In this case, an OLED pixel circuit may be formed on the silicon-based substrate using a MOS (metal-oxide-semiconductor) integrated circuit technology. For example, the silicon-based substrate is selectively doped to form a source electrode region and a drain electrode region of a MOS transistor and thus to form a pixel circuit based on a MOS transistor process. That is, the array substrate provided by the embodiment of the present disclosure may be either an array substrate based on the glass substrate or the organic flexible substrate, or an array substrate based on the silicon-based substrate.

For example, in the example illustrated in FIG. 6A, the first contact electrode 201 and the second contact electrode 202 are formed in a same layer. For example, the first contact electrode 201 and the second contact electrode 202 are formed in a same layer as the source-drain electrode layer, for example, the first contact electrode 201, the second contact electrode 202 and the source-drain electrode layer are formed by a same patterning process. For example, the first contact electrode 201 is embodied as the source electrode 316, that is, the first contact electrode 201 is integral with the source electrode 316; the second contact electrode 202 is electrically connected to a data line in the display region for binding the data line to the data driving circuit. For example, the first contact electrode 201 and the source electrode 316 are respectively formed and are electrically connected with each other.

For example, in one example, the first contact electrode 201 and the second contact electrode 202 are not formed in the same layer as the source-drain electrode layer, and for example, the first contact electrode 201 is formed in a top conductive layer (not shown) on the source-drain electrode layer, and is electrically connected to the source-drain electrode layer through a via hole.

For example, in the example illustrated in FIG. 6B, the first contact electrode 201 and the source-drain electrode layer are formed in a same layer, and the second contact electrode 202 and the gate electrode layer are formed in a same layer. For example, the second contact electrode 202 is electrically connected to a lead of the gate line in the display region for binding the gate line to the gate driving circuit.

In addition, referring to FIG. 4C, in the embodiment illustrated in FIG. 6A and FIG. 6B, a second electrode 27 is formed in the second via hole 25 to be electrically connected to the second contact electrode 202 and provide a protection for the second contact electrode 202, and the like.

It should be noted that the source electrode and the drain electrode of the transistor adopted here may be symmetrical in structure, so the source electrode and the drain electrode are structurally indistinguishable, and therefore the two can be interchanged as required. Moreover, in FIG. 6A and FIG. 6B, the driving transistor 311 is of a top gate type, but no limitation is imposed to the specific type of the transistor in embodiments of the present disclosure, and the driving transistor 311 may be of a top gate type, a bottom gate type, or the like, and with cases where the transistors are of different types, layers on the base substrate are correspondingly different.

The Step S702 to the step S706 are basically the same as the step S201 to the step S205 described above and are not described here.

Step S707: forming a first electrode 26 electrically connected to the connection portion 23.

As described above, the connection portion 23 is enabled to have the flat surface by a grinding process or the like, and thus the first electrode 26 and the connection portion 23 have the flat contact interface, which is beneficial to forming the good electrical contact between the first electrode 26 and the connection portion 23.

For example, in one example, the first electrode 26 is formed as an electrode of an organic light emitting diode, such as an anode or a cathode, that is, the connection portion 23 is used to connect the light emitting diode and the driving transistor 311. For example, a material of the first electrode 26 is a metal or a conductive metal oxide with a high work function; for another example, in order to form an organic light emitting diode of a top emission type, the first electrode 26 includes a conductive material with a high reflectivity ratio, for example, a stacked structure including a metal layer and a conductive metal oxide layer (for example, indium tin oxide, etc.), and the metal layer is electrically connected to the connection portion 23.

For example, the first electrode 26 is formed by an evaporation process and a patterning process.

Step S708: forming a light emitting layer 261 and a third electrode 262 sequentially on the first electrode 26 to form an organic light emitting diode 30.

For example, a pixel defining layer (PDL) 28 is formed on the first electrode 26, and an opening exposing at least a portion of the first electrode 26 is formed in the pixel defining layer 28 by a patterning process to define a light emitting region. Then, a light emitting layer 261 and a third electrode 262 are sequentially formed on the first electrode 26 corresponding to the opening in the pixel defining layer 28, and thus the organic light emitting diode 30 is formed.

For example, the pixel defining layer 28 is made of an organic material such as Polyimide (PI) or other organic resins. A forming process of the pixel defining layer 28 includes, for example, coating a PI solution and curing the PI solution to form a PI layer, and then patterning the PI layer to form the pixel defining layer 28.

For example, the light emitting layer 261 and the third electrode 262 are formed by an evaporation process. The organic light emitting diode may further include a hole injection layer, a hole transport layer, an electron transport layer, an electron injection layer, etc. as required.

For example, the third electrode 262 is formed as a cathode of the organic light emitting transistor, such as a metal conductive material with a low work function. For example, in order to form the organic light emitting diode of the top emission type, the third electrode is made of a conductive material with a high transmittance ratio, for example, a stacked structure (for example, a Ag/ITO structure) including a metal material with a high conductivity ratio and a conductive metal oxide material with a high transmittance ratio.

In another example, the first electrode 26 is formed as a cathode of the organic light emitting diode, and correspondingly, the third electrode 262 is formed as an anode of the organic light emitting diode.

For example, because the connection portion 23 has the flat surface, and the connection portion 23 and the first electrode 26 have a flat interface, the light emitting layer formed on the connection portion 23 and the first electrode 26 can grow on a flat interface, which helps to improve a light emitting performance.

At least one embodiment of the disclosure further provides an array substrate and a display device comprising the array substrate, and the array substrate is formed by the manufacturing method mentioned above. The display device is, for example, a liquid crystal display device, an organic light emitting diode display device, or the like.

What have been described above are only specific implementations of the present disclosure, the protection scope of the present disclosure is not limited thereto. The protection scope of the present disclosure should be based on the protection scope of the claims.

What is claimed is:

1. A manufacturing method of a via-hole connection structure, comprising:
    forming an insulation layer on a base substrate and forming a first via hole in the insulation layer;
    forming a connection portion in the first via hole;
    forming a protection layer covering the connection portion on a surface of the insulation layer;
    forming a second via hole in the insulation layer and in the protection layer; and
    removing at least a portion of the protection layer to expose the connection portion,
    wherein removing the at least a portion of the protection layer comprises:
        coating a first photoresist layer on the protection layer, and exposing and developing the first photoresist layer using a first mask plate to form a first etching mask, wherein the first etching mask comprises a portion remaining in the second via hole; and
        etching the protection layer using the first etching mask.

2. The manufacturing method according to claim 1, further comprising:
    forming a first contact electrode and a second contact electrode on the base substrate before forming the insulation layer,
    wherein the insulation layer covers the first contact electrode and the second contact electrode,
    the first via hole exposes at least a portion of the first contact electrode and the second via hole exposes at least a portion of the second contact electrode, and
    the first contact electrode is electrically connected to the connection portion.

3. The manufacturing method according to claim 2, wherein the first contact electrode and the second contact electrode are formed in a same layer on the base substrate.

4. The manufacturing method according to claim 1, wherein forming the second via hole in the insulation layer and in the protection layer comprises:
    coating a second photoresist layer on the protection layer, and exposing and developing the second photoresist layer using a second mask plate to form a second etching mask; and
    etching the protection layer and the insulation layer using the second etching mask to form the second via hole.

5. The manufacturing method according to claim 4, wherein the first mask plate and the second mask plate are a same mask plate or have a same pattern, and
    the first photoresist layer and the second photoresist layer respectively adopt photoresist materials with opposite photosensitive properties.

6. The manufacturing method according to claim 1, wherein forming the connection portion comprises:
    forming a conductive layer on the insulation layer, wherein the conductive layer fills the first via hole, and
    performing a polishing treatment to remove the conductive layer on the surface of the insulation layer to allow the conductive layer to flush with the insulation layer.

7. The manufacturing method according to claim 1, further comprising:
    forming a first electrode on the insulation layer after removing the at least a portion of the protection layer, wherein the first electrode is electrically connected to the connection portion.

8. The manufacturing method according to claim 7, further comprising:
    forming a second electrode in the second via hole at a same time as forming the first electrode.

9. A manufacturing method of an array substrate, comprising:
    forming an insulation layer on a base substrate and forming a first via hole in the insulation layer;
    forming a connection portion in the first via hole;
    forming a protection layer covering the connection portion on a surface of the insulation layer;
    forming a second via hole in the insulation layer and in the protection layer; and
    removing at least a portion of the protection layer to expose the connection portion,
    wherein removing the at least a portion of the protection layer comprises:

coating a first photoresist layer on the protection layer, and exposing and developing the first photoresist layer using a first mask plate to form a first etching mask, wherein the first etching mask comprises a portion remaining in the second via hole; and etching the protection layer using the first etching mask.

10. The manufacturing method according to claim 9, wherein the array substrate comprises a display region and a bonding pad region, and the first via hole is in the display region and the second via hole is in the bonding pad region.

11. The manufacturing method according to claim 10, further comprising:

forming a first contact electrode and a second contact electrode on the base substrate before forming the insulation layer, wherein the insulation layer covers the first contact electrode and the second contact electrode, the first via hole exposes at least a portion of the first contact electrode, the second via hole exposes at least a portion of the second contact electrode, and the first contact electrode is electrically connected to the connection portion.

12. The manufacturing method according to claim 11, further comprising:

forming a first electrode on the insulation layer after removing the at least a portion of the protection layer, wherein the first electrode is electrically connected to the connection portion.

13. The manufacturing method according to claim 12, further comprising:

forming a light emitting layer and a second electrode sequentially on the first electrode to form an organic light emitting diode.

14. The manufacturing method according to claim 10, wherein the array substrate comprises a source-drain electrode layer and a gate electrode layer, the first contact electrode and the second contact electrode are formed in a same layer as the source-drain electrode layer, or the first contact electrode and the second contact electrode are respectively formed in a same layer as the source-drain electrode layer and the gate electrode layer.

15. An array substrate formed by the manufacturing method according to claim 9.

16. A display device, comprising the array substrate according to claim 15.

17. The manufacturing method according to claim 9, wherein forming the connection portion comprises:

forming a conductive layer on the insulation layer, wherein the conductive layer fills the first via hole, and performing a polishing treatment on the conductive layer to allow the conductive layer to flush with the insulation layer.

18. A manufacturing method of a display device, comprising:

forming an insulation layer on a base substrate and forming a first via hole in the insulation layer;

forming a connection portion in the first via hole;

forming a protection layer covering the connection portion on a surface of the insulation layer;

forming a second via hole in the insulation layer and in the protection layer; and removing at least a portion of the protection layer to expose the connection portion, wherein removing the at least a portion of the protection layer comprises:

coating a first photoresist layer on the protection layer, and exposing and developing the first photoresist layer using a first mask plate to form a first etching mask, wherein the first etching mask comprises a portion remaining in the second via hole; and etching the protection layer using the first etching mask.

* * * * *